United States Patent
Farnworth

(10) Patent No.: US 6,168,969 B1
(45) Date of Patent: Jan. 2, 2001

(54) SURFACE MOUNT IC USING SILICON VIAS IN AN AREA ARRAY FORMAT OR SAME SIZE AS DIE ARRAY

(75) Inventor: Warren M. Farnworth, Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 08/909,785

(22) Filed: Aug. 12, 1997

Related U.S. Application Data

(62) Division of application No. 08/601,302, filed on Feb. 16, 1996, now Pat. No. 5,973,396.

(51) Int. Cl.⁷ .......................... H01L 21/44; H01L 21/48; H01L 21/50; H01L 21/82; H01L 21/326; H01L 21/479

(52) U.S. Cl. .......................... 438/106; 438/130; 438/131; 438/132; 438/467; 438/600; 438/601

(58) Field of Search .................... 438/106, 130, 438/131, 132, 467, 600, 601

(56) References Cited

U.S. PATENT DOCUMENTS

| | | |
|---|---|---|
| 3,761,782 | 9/1973 | Youmans . |
| 3,947,840 | 3/1976 | Craford et al. . |
| 4,499,655 | 2/1985 | Anthony . |
| 5,229,647 | 7/1993 | Gnadinger . |
| 5,378,927 | 1/1995 | McAllister et al. . |
| 5,406,125 | 4/1995 | Johnson et al. . |
| 5,455,445 | * 10/1995 | Kurtz et al. . |
| 5,510,655 | 4/1996 | Tanielian . |
| 5,528,080 | 6/1996 | Goldstein . |
| 5,552,338 | * 9/1996 | Kang . |
| 5,552,633 | 9/1996 | Sharma . |
| 5,608,264 | 3/1997 | Gaul . |
| 5,623,160 | * 4/1997 | Liberkowski . |
| 5,675,180 | 10/1997 | Pedersen et al. . |
| 5,682,062 | 10/1997 | Gaul . |

* cited by examiner

Primary Examiner—Jey Tsai
Assistant Examiner—Josetta Jones
(74) Attorney, Agent, or Firm—Trask Britt

(57) ABSTRACT

A die incorporating vertical conductors, or vias, extending from active and passive devices on the active die side to the back side thereof. The vias are preferably formed in the die material matrix by introduction of a conductive material as known in the art. Such die may be employed in singulated fashion on a carrier substrate as an alternative to so-called "flip chip" die, or in vertically-stacked fashion to form a sealed multi-chip module the same size as the die from which it is formed. Certain vias of the various dice in the stack may be vertically aligned or superimposed to provide common access from each die level to a terminal such as a bond pad or C4 or other connection on the back side of the lowermost die contacting the carrier, while other stacked vias are employed for individual access from each die level to the carrier through the back side of the lowermost die. Vertical or horizontal fuse elements may be employed at some or all die levels to permit different circuit configurations on otherwise identical dice and to isolate devices at certain die levels from selected vias. Vias may be placed at any location within the periphery of a die and are preferably placed in superimposition or immediate lateral proximity to the devices on the various dice to minimize horizontal conductors whenever possible and thus employ more die surface area for device fabrication.

33 Claims, 3 Drawing Sheets

SURFACE MOUNT IC USING SILICON VIAS IN AN AREA ARRAY FORMAT OR SAME SIZE AS DIE ARRAY

This is a division of application Ser. No. 08/601,302, filed Feb. 16, 1996 now U.S. Pat. No. 5,973,396.

BACKGROUND OF THE INVENTION

1. Field of the Invention

The present invention relates to semiconductor devices and associated integrated circuit configurations and, more particularly, to bare die configurations and stacked multi-chip (bare die) assemblies with chip-integral vertical connection circuitry and a method of fabricating such die and assemblies.

2. State of the Art

As computers and other microprocessor-dependent electronics become physically more compact and operate at ever-faster speeds, the amount of "real estate" available on circuit boards and other component-supporting substrates becomes ever-smaller. Various die packaging schemes have evolved to promote greater component density, one of the most recently prevalent being surface mount technology (SMT). In an SMT package, "footprint" size is reduced by use of small leads placed at a fine pitch, sometimes in combination with staggered rows of terminal bond pads about substantially the entire exterior of a circuit package. The SMT pads or lead ends generally extend immediately below the package and not first laterally, as in most prior art dual-in-line (DIP) and small-outline J-lead packages (SOJ). Another attempt to increase component density by vertical component orientation has resulted in the so-called zig-zag inline package (ZIP).

Multi-chip modules (MCM's), wherein several chips or dice for the same or different functions are mounted in a common package, generally mount all dice in the module on a supporting substrate in the same horizontal plane, such as is the case in a single in-line memory module (SIMM) including a plurality of dynamic random access memory (DRAM) dice.

It has, however, been recognized that it may be desirable in certain applications to enhance component density by laterally stacking vertically-oriented die or die support substrates on a transversely-oriented carrier substrate to which electrical access is secured via edge connect structures on the die or die support substrates. U.S. Pat. Nos. 5,266,833; 4,983,533; and 4,764,846 are exemplary of state of the art lateral die stacking approaches. Such structures, while increasing component density, obviously require conductors extending to at least one side of the stacked die or die support substrate, which may effectively limit the number of connections to the carrier substrate. If terminals are placed on more than one edge of a die (see the '833 patent), the die support substrate or other bus structure becomes somewhat complex. Further, edge-accessing die or die support substrates dictates that all inter-die or inter-die support electrical connections must be effected through the carrier substrate without the potential for direct die-to-die connection.

It has also, however, been recognized that it may be desirable in certain applications to vertically stack horizontally-disposed dice in two or more layers. U.S. Pat. Nos. 5,481,134; 5,481,133; 5,468,997; 5,455,445; 5,434,745; and 5,128,831 are exemplary of state of the art vertical die stacking approaches. Also illustrative of the state of the art in that regard is "Laminated Memory: A new 3-Dimensional Packaging Technology for MCM's", *Proceedings of* 1994 *IEEE Multi-Chip Module Conference*, pp. 58–63. Further examples of such structures are the commercially available Micro SMT Packages from Micro SMT, Inc., depicted and described in a Micro SMT, Inc. brochure bearing a 1993 copyright. Existing vertical stack MCM's, while increasing component density, usually laterally offset active and passive devices in a given plane or layer of a stack from the vertical, interlayer conductors, necessitating the use of horizontal circuit traces extending from the devices to the edge of each die or at the very least to a peripheral area of the die. Such offsets increase the lateral size or footprint of the stack and are somewhat limiting with respect to the number of devices per layer, even if the vertical conductors are formed as contact holes or vias in the silicon die material itself, which is not common practice. It has also been suggested in the art to employ diffused metal pillars connected to horizontally offset active devices of the die by laterally extending circuit traces.

Therefore, it would be extremely advantageous to form passive and active devices and vertical conductors, hereinafter generally referred to herein as vias, respectively on and within dice, and in vertically superimposed relationship to the extent possible. Such an approach would permit electrical connection of a die to other dice or a supporting substrate such as a printed circuit board (PCB) through the back side of the die, using that heretofore unused or underemployed die side in lieu of the so-called "active" or top side. It would also be highly beneficial to minimize the number of vias when stacking dice by accessing a single, commonly-required via within the die perimeter for (by way of example for a DRAM die) CAS, RAS, I/O, power, and ground from each level or plane in the die stack, thus requiring dedicated vias to each level only for the chip-select function. Finally, it would simplify and expedite fabrication of such die structures to employ via formation techniques which do not involve forming and filling holes extending vertically through the die.

SUMMARY OF THE INVENTION

The present invention comprises a method for forming a bare die suitable for back side electrical connection to a carrier, as well as for multi-layer, or vertically stacked, multi-chip (bare die) assemblies employing metalzed silicon vias for vertical interconnection of the dice to each other and to a carrier substrate to which the die stack is electrically connected. The present invention provides the ability to fabricate a protected package of stacked dice with a surface-mount terminal array on the bottom or back side of the lowermost die for mounting to a conductor-bearing carrier substrate.

The present invention includes at least one, and preferably a plurality, of silicon or other suitable die (such as gallium arsenide) on which integrated electronic devices are formed and through which vertically-extending electrical conductors (vias) extend in a pattern to maximize component and circuit density on the die.

In the method of the invention, vias are formed as conductive pillars through the die material from the top or active surface thereof to the bottom. The pillars may be formed by doping of a conductive material onto the top die surface and gravity diffusion of the conductor through the silicon. Vertical diffusion may be enhanced, and lateral diffusion curtailed, by electrochemically anodizing the die using a mask to create the desired via pattern, or by appropriate crystallographic orientation of the silicon die material to facilitate channeling of the conductive material through the silicon matrix. Alternatively, ion implantation of the conductor through a suitably patterned mask may be employed to create the vias.

Subsequent to via formation, active or passive integrated devices or components and other structures may be formed on the active surface of the die. If an active component, the structure is formed by one of several epitaxial film deposition and doping processes as known in the art. If a passive component or bond pad, the structure may likewise be formed by any additive or subtractive material deposition process, or combination thereof, as known in the art. The components and surface conductors, such as bond pads, are preferably formed in superimposition to the vias rather than laterally offset therefrom.

If the die in question is employed singly on a supporting substrate, or is the uppermost die of a stack, an insulating, protective layer such as silicon dioxide, doped silicon dioxide (PSG, BPSG), silicon nitride or a polyimide may be applied over the entire active surface since all electrical connections are made from the back of the die. If a die stack is formed, a protective layer as required may additionally be formed about the sides of the stack or a shielding adhesive applied between the stacked dice and the lowermost die and the carrier substrate.

Each die of the preferred plurality is provided with vias to interconnect with dice above or below it or a carrier substrate, as the case may be. Vertically-aligned vias extending from the carrier substrate through each die to and through the uppermost die comprise a commonly-accessed conductive vertical pathway from the substrate to each die in the stack for such commonly-required functions as power, ground, I/O, CAS, RAS, etc. Discrete or individual vertical pathways for chip-selects extend to each of the various dice, so that each die accesses the carrier substrate for commonly-required functions commonly and discrete functions individually. It is contemplated that dice to be employed in a stack may have the same or different components but a common via layout for easy superimposition. The overall circuit defined by the die stack may then be customized by the number and type of die employed and the use of laser-blown or electrically-blown fuse elements, as known in the art, incorporated in the die circuitry of each die. Thus, a via stack may be electrically connected to components at one die level, but not at those above or below, serving only at the other (unconnected) die levels as a bypass conductor.

The back of each die may include terminal structures such as bond pads for interconnection to the next lower die, and the silicon may be etched using a suitable mask to cause the lower portions of the pillar-vias to protrude for connection to bond pads or components on the next adjacent lower layer. If the die in question is designated as the "base" or lowermost die of the stack, appropriate metalization in the form of circuit traces may be applied to the die back side over a suitable insulating layer, if required, (to, among other things, prevent inadvertent "doping" of the back side of the die by the metal traces) to achieve a desired connection pattern for flip-chip style connection (as, for example, by controlled collapse chip connection, or C4, bonding) to the carrier substrate.

DETAILED DESCRIPTION OF THE PREFERRED EMBODIMENTS

Figure 1A:
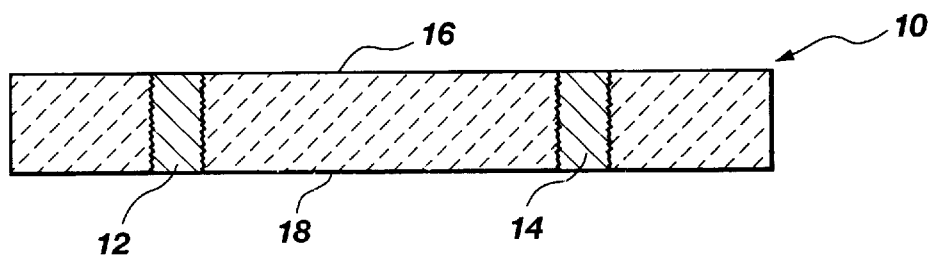
FIGS. 1A, 1B and 1C schematically depict the basic fabrication sequence of a die according to the present invention.
Figure 1B:
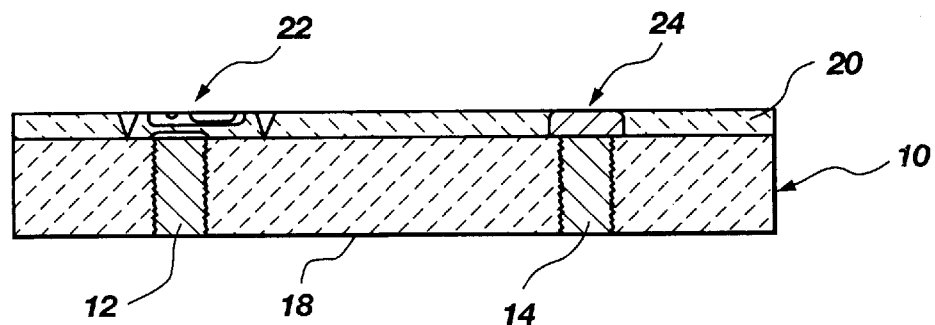
Figure 1C:
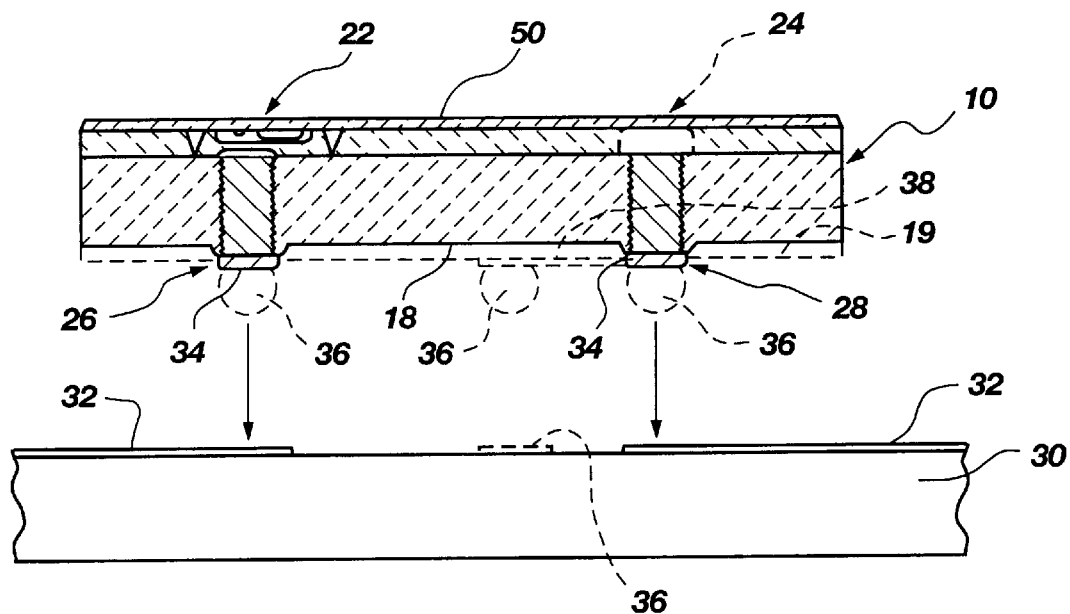

Referring now to FIGS. 1A, 1B and 1C, an exemplary silicon die 10 is depicted. It should be understood that fabrication of the present invention will normally be effected at least partially at the wafer level, and that reference to a single die is for descriptive purposes only, and not limiting of the applicability of the invention to such a structure.

FIG. 1A depicts die 10 in an essentially pristine state, being modified only by the addition of conductive exemplary vias 12 and 14, extending from what will become the front side or active side 16 of die 10 to the back side 18 thereof. Vias 12 and 14 may be formed by any process known in the art. However, it is preferred and significant to the invention that the vias be formed in situ in the silicon matrix of the die without prior physical removal of the die material.

By way of example only, vias may be formed by gravitationally-induced diffusion of metal applied (as by doping) through apertures in a mask or other protective layer on active side 16. Exemplary diffusible metals possessing suitable conductivity and without undue resistivity include, by way of example, Au and Al. Other suitable metals are known in the art. One limitation to the utility of diffusion-forming vias is significant lateral migration of the diffusing metal, which may be somewhat limiting as far as via density due to spacing requirements. Vertical diffusion speed may be enhanced and lateral migration reduced through selective electrochemical anodization of the die using a masking technique as referenced in the aforementioned U.S. Pat. No. 5,455,455 and described in detail in U.S. Pat. No. 5,386,142, the disclosure of both of these patents being incorporated herein by this reference. Another approach to enhancing beneficial vertical diffusion while curtailing lateral spread of the diffused conductor is selective crystallographic orientation of the silicon die material to facilitate channeling of the conductive material through the silicon matrix. An alternative to diffusion is ion-implantation of the conductor material, which is relatively rapidly effected in comparison to diffusion techniques, and similarly limits lateral spread of the conductive material of the via.

Figure 3:
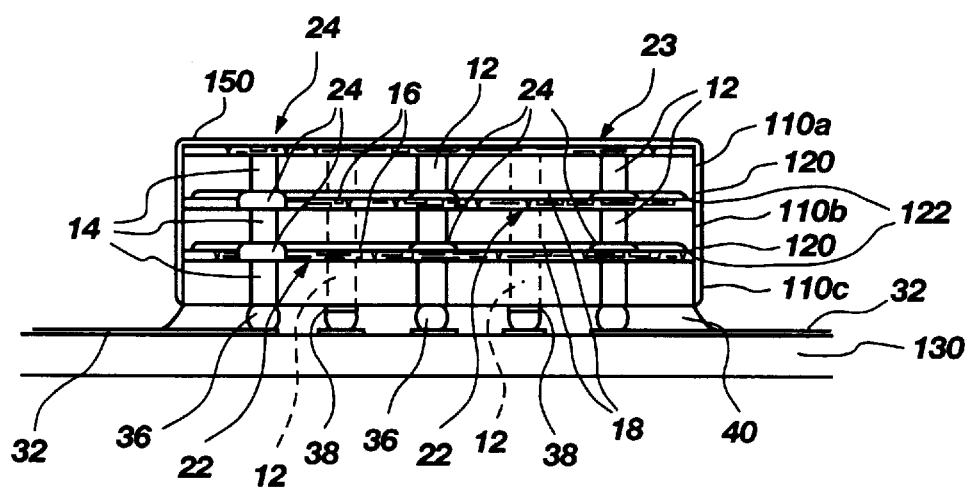
FIG. 3 schematically depicts a stack of three dice according to the present invention mounted to a carrier substrate.

Referring to FIG. 1B, after vias 12 and 14 are formed, epitaxial layer 20 can be formed on active side 16 if active devices are to be fabricated over vias 12 on die 10. Active devices such as 22, superimposed on or immediately adjacent via 12, are then formed by means well known in the art. Active devices may include, by way of example and not limitation, any such devices known in the art such as diodes, transistors, and memory (ROM, PROM, EPROM, EEPROM, bubble, DRAM, SRAM) including subcomponents such as transistors, capacitors and fuses. Active devices may also be fabricated in the original silicon of the die, as known in the art. Passive devices 23 (FIG. 3)

(resistors, capacitors, fuses, etc.) may similarly be formed on or into die 10, again by means well known in the art. Devices offset from vias 12 and 14 may be connected to such by lateral or horizontal circuit traces. Finally, if a via is to serve as a through or relay via, a bond pad 24 as depicted capping via 14 may be formed as well known in the art to provide an electrical path to a higher die in a stack of which die 10 is a part.

Figure 2:
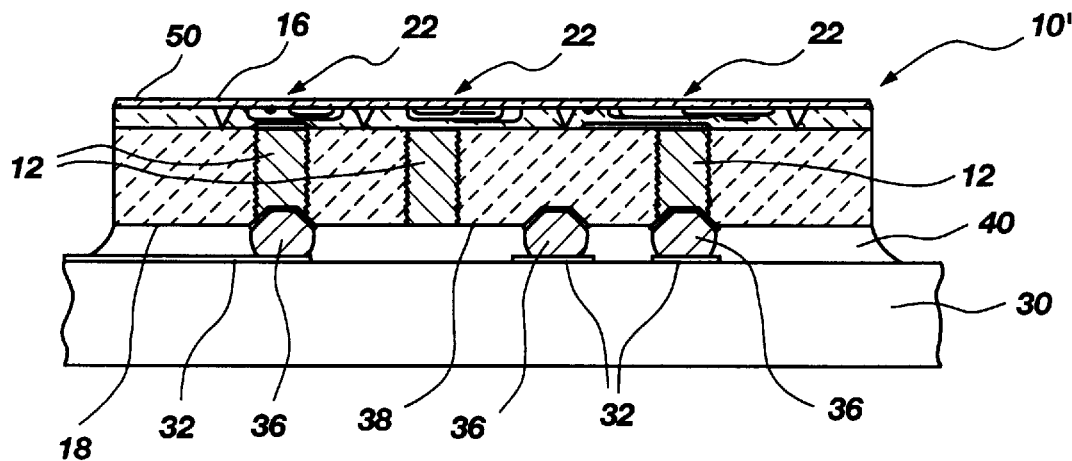
FIG. 2 schematically depicts a die according to the present invention configured for singulated affixation to a carrier substrate and including a protective layer over the active surface, as well as back side contact structures for electrical connection to the carrier.

Referring to FIG. 1C, if die 10 is to be employed as a singulated bare die and secured to a carrier substrate such as substrate 30 bearing conductive traces 32, or is employed as the top die in a stack as depicted in FIG. 2, a protective layer 50, such as silicon dioxide, doped silicon dioxide (PSG, BPSG), silicon nitride or a polyimide, may be applied over the entire active surface and all components thereon since all electrical connections are made from the back of the die.

Again referring to FIG. 1C, die 10 includes back side terminal structures 26 and 28 for connection to bond pads 24 on the top of a lower die of a stack or for connection to traces, 32 of carrier substrate 30. Terminal structures may comprise applied metalization in the form of bond pads 34. Alternatively, or in addition to, the formation of bond pads 34, a selected depth 19 of the back side 18 of die 10 may be selectively etched after being masked, as known in the art, to cause vias 12 and 14 to project downwardly from back side 18, as shown, and provide enhanced clearance between die 10 and the next lower die in the stack, or between die 10 and carrier substrate 30. If the latter application is intended for die 10, C4 or similar flip-chip style conductive bumps or protrusions 36 may be formed directly under a via. Alternatively, back side 18 may be provided with metalization in the form of circuit traces 38, which re-pattern some or all of the external electrical connections of the die 10 or of the entire die stack as required by the substrate input/output or I/O pattern, circuit traces 38 thus terminating in conductive bumps or protrusions 36. As known in the art, a non-conductive underfill may then be introduced between back side 18 and carrier substrate 30.

Referring to FIG. 2 of the drawings, exemplary singulated die 10', intended for non-stacked usage, is depicted affixed to a carrier substrate 30, die 10' being employed alone or in combination with other such dice or dice of other configurations such as in a SIMM or other MCM. Elements as previously identified with regard to FIGS. 1A through 1C are referenced in FIG. 2 by the same numerals. Non-conductive protective underfill 40 is depicted in FIG. 2.

Referring to FIG. 3 of the drawings, a three-die stack including die 110a, 110b and 110c is depicted assembled and mounted to a carrier substrate 130. Elements in FIG. 3, which are the same as those in FIGS. 1 and 2, are identified by the same reference numerals. Die stack 110 is encapsulated, top and sides, by a protective layer 150 such as polyimide or low temperature chemical vapor deposition (CVD) nitride. Dies 110a and 110b are provided with protective dams 120 projecting downwardly from back sides 18 about the entire die periphery to about the active sides 16 of the next lower die. An adhesive or other protective non-conductive filer or sealant 122, as desired, may be applied between the lower end of each dam 120 and the active side 16 to effect a die-to-die seal and eliminate the need to side-coat the die stack 110 with a protective layer 150, so that only a protective layer 150 on the top die 110a is required. As shown in broken lines, vias 12 and 14 may be placed in any configuration in dice 110a, 110b, and 110c.

Figure 4:
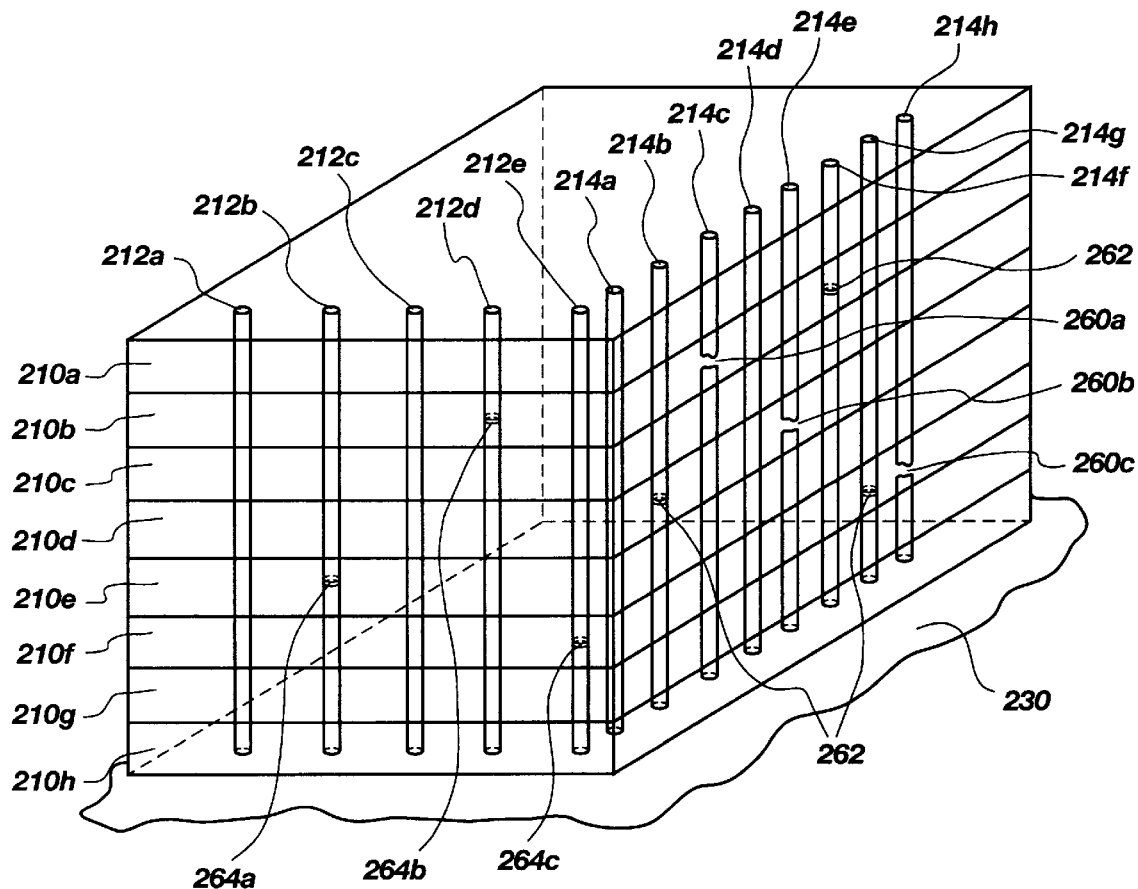
FIG. 4 depicts a perspective schematic of a stack of eight dice according to the present invention, illustrating the use of vertically-superimposed vias for connections commonly required by each die in the stack.

Referring to FIG. 4 of the drawings, an eight-die stack including dice 210a, 210b, 210c, 210d, 210e, 210f, 210g, and 210h are depicted mounted on and electrically connected to a carrier substrate 230. As can be seen schematically, a series of common-access via stacks 212a, 212b, 212c, 212d and 212e extend vertically through all eight dice and are accessed by each. A second series of discrete access via stacks 214a, 214b, 214c, 214d, 214e, 214f, 214g, and 214h provide an individual chipselect function to each die in the stack. Thus, the total number of required via stacks equals only the number required for common access to the carrier substrate, plus the number required for discrete access (generally equal to the number of dice in the stack).

As the number of die in the stack increases, the benefits of the present invention become more apparent in terms of reducing the relative die real estate required for conductors to access the carrier substrate and permitting shrinkage of the die stack. Several exemplary programmable blown or open fuse elements 260a, 260b and 260c are also depicted in FIG. 4, such open fuse elements isolating a die above a certain level from a particular via stack. Thus, for example, a chip-select via for the base dice 210h may be isolated from the remaining seven (7) die above it. Other vias may similarly be isolated. Programmable antifuses, as known in the art, may similarly be employed to selectively connect, rather than disconnect, conductors on and between dice. Several programmable activated or closed fuse elements are depicted at 264a, 264b, and 264c. Fuses and antifuses may, of course, be employed in combination on the same die and on adjacent dice.

While the activated fuses and antifuses have been shown as part of the vias themselves, it should be understood that the concept of isolating or selectively connecting die levels is not so limited, as horizontally extending fuse and antifuse elements may also be employed, as may antifuses.

If a vertical fuse-isolation approach is used, polysilicon or oxide 262, located in a via segment (see FIG. 4), is a suitable fuse element which may be blown with a high current.

Figure 5:
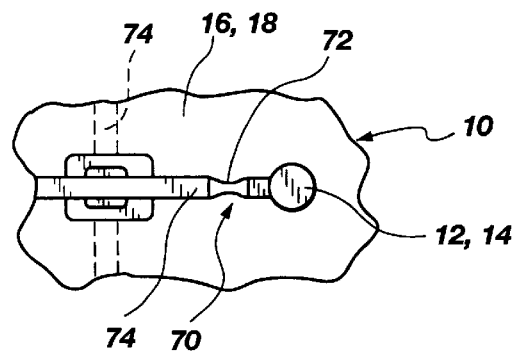
FIG. 5 is a top elevation of an active surface of a die depicting an exemplary fuse element usable in the present invention.

If a horizontal fuse-isolation approach is used (see FIG. 5), a thin film 70 of nichrome or titanium-tungsten, optionally with a necked-down portion 72, may be employed on the active side 16 or back side 18 of a die 10 between a horizontal conductive path 74 and a vertically-extending via 12 or 14.

Suitable antifuse technology is disclosed, by way of example, in U.S. Pat. Nos. 5,110,754 and 5,324,681, the disclosures of which are hereby incorporated by this reference. See also U.S. Pat. Nos. 5,485,031 and 5,485,032.

Of course, depending upon the fuse and antifuse locations and the overall circuitry pattern, fuses may be blown and antifuses activated or closed on the individual die prior to stacking or after the stack is assembled. It is preferable to qualify known good die (KGD) after the fuses are blown and antifuses closed at die or wafer-level, and then fabricate a KGD stack for assured greater yield of the ultimate, resulting MCM.

It is contemplated that a die on top of a stack may be configured with antifuse connections to all chip selects of the lower die in the stack. With such an arrangement, if a die of the stack fails during burn-in or test, one can then contact the upper die with probes or through electrical programming and activate or close the antifuses to "add" the top die to the circuit to replace the defective lower die. Standard fuse methodology is used to "remove" the bad die from the circuit. A known good die is preferably employed as the top die in the stack.

While the present invention has been described in terms of certain illustrated embodiments, it is not so limited. Those of ordinary skill in the art will understand and appreciate that many additions, deletions and modifications to the embodiments as specifically disclosed herein may be made without departing from the scope of the invention as hereinafter claimed. For example, a lowermost die may be used to laterally reroute the via pattern from one designed to best accommodate the sizes, configurations and various placements of components on the die above to a standardized or other selective pattern on a carrier substrate. Rerouting conductors may be formed on the upper side of the rerouting die to contact terminals on the back side of the next-uppermost die. The rerouting conductors would then extend to vias in the rerouting die for connection to traces on the carrier. It is also contemplated that dice of different size and shape may be stacked, as long as the vias vertically electrically connecting them are aligned. It is further contemplated that the invention has utility in paralleling processors by stacking the processors. In such a case, there would be additional pin types connected, such as clock inputs/outputs, etc., as well known in the art.

What is claimed is:

1. A method of fabricating a die substrate, comprising:
   providing a die substrate including a material suitable for fabrication of active semiconductor devices, the die substrate having a front side, a back side, and a lateral periphery;
   forming in situ at least one electrically conductive via through an imperforate region of the die substrate between the front side and the back side thereof and within the lateral periphery;
   providing an epitaxial layer extending over at least a portion of the front side of the die substrate;
   fabricating an active semiconductor device adjacent the front side of the die substrate and in electrical communication with the at least one electrically conductive via; and
   selectively altering connectivity of an electrically conductive path extending through the at least one electrically conductive via in the die substrate.

2. The method of claim 1, further comprising forming at least a second via extending between the front side and the back side of the die substrate; and
   forming a terminal structure on the at least second via for electrical communication by that via to a structure placed either above or below the die substrate.

3. The method of claim 2, further comprising assembling a plurality of die substrates, at least some of which include an active semiconductor device and all of which include a plurality of electrically conductive vias extending therethrough so that multiple electrically conductive vias of each die substrate of the plurality of die substrates are in mutual vertical alignment with electrically conductive vias of at least another die substrate of the plurality of die substrates.

4. The method of claim 3, further including selectively electrically isolating at least one of the active semiconductor devices from at least one of the electrically conductive vias in the same die substrate of the plurality of die substrates as that active semiconductor device.

5. The method of claim 4, wherein selectively isolating the at least one active semiconductor device from the electrically conductive via comprises blowing a fuse.

6. The method of claim 3, further including selectively opening a conductive path extending through at least one of the electrically conductive vias in at least one of the die substrates of the plurality of die substrates.

7. The method of claim 6, wherein selectively opening the conductive path comprises blowing a fuse.

8. The method of claim 3, further including selectively electrically communicating at least one of the active semiconductor devices with at least one of the electrically conductive vias in the same die substrate of the plurality of die substrates as that active semiconductor device.

9. The method of claim 8, wherein selectively electrically communicating the at least one active semiconductor device comprises activating an antifuse.

10. The method of claim 3, further including selectively completing an electrically conductive path through at least one of the plurality of electrically conductive vias extending through at least one of the die substrates of die substrates.

11. The method of claim 10, wherein selectively completing the electrically conductive path comprises activating an antifuse in the at least one of the plurality of electrically conductive vias.

12. The method of claim 3, further including assembling the plurality of die substrates on a carrier substrate and electrically communicating the active semiconductor devices of the die substrates to the carrier substrate through the electrically conductive vias.

13. The method of claim 12, further including assembling the plurality of die substrates so that at least one set of vertically aligned electrically conductive vias may be employed by at least some of the active semiconductor devices to commonly access the carrier substrate for a selected function.

14. A method of remediating a stack of a plurality of dice defining a circuit and having a plurality of vias extending therethrough from the bottom of the stack to the top, comprising:
   providing a top die including an antifuse connection to a chip select of at least one other, lower die in the stack, the at least one other, lower die in the stack being in electrical communication with the circuit through at least one fuse; and adding the top die to said circuit by activating the antifuse connection and removing the at least one other, lower die from the circuit by blowing the at least one fuse.

15. The method of claim 14, further comprising providing the top die including an antifuse connection to chip selects of all other, lower dice in the stack, said all other, lower dice each being in electrical communication with the circuit through at least one fuse;
   establishing one of the all other lower dice as bad; and
   adding the top die to said circuit by activating the antifuse connection to the chip select of the bad die and removing the bad die to the circuit by blowing the at least one fuse by which the bad die is in electrical communication with the circuit.

16. A method of fabricating a die substrate, comprising:
   providing a die substrate including a material suitable for fabrication of active semiconductor devices, the die substrate having a front side, a back side, and a lateral periphery;
   forming in situ at least two electrically conductive vias through an imperforate region of the die substrate between the front side and the back side thereof and within the lateral periphery;
   providing an epitaxial layer extending over at least a portion of the front side of the die substrate;
   fabricating an active semiconductor device adjacent the front side of the die substrate and in electrical communication with at least one of the vias;
   forming a terminal structure on one of the at least two vias for electrical communication by that via to a structure placed either above or below the die substrate;

assembling a plurality of die substrates, at least some of which include an active semiconductor device and all of which include a plurality of vias extending therethrough so that multiple vias of each die substrate are in mutual vertical alignment with vias of at least another die substrate; and selectively opening a conductive path extending through at least one of the vias in at least one of the die substrates.

17. The method of claim 16, wherein selectively opening a conductive path comprises blowing a fuse.

18. A method of fabricating a die substrate, comprising:

providing a die substrate of including a material suitable for fabrication of active semiconductor devices, the die substrate having a front side, a back side, and a lateral periphery;

forming in situ at least two electrically conductive vias through the die substrate between the front side and the back side thereof and within the lateral periphery;

fabricating an active semiconductor device on the front side of the die substrate and in electrical communication with at least one of the vias;

forming a terminal structure on one of the at least two vias for electrical communication by that via to a structure placed either above or below the die substrate;

assembling a plurality of die substrates, at least some of which include an active semiconductor device and all of which include a plurality of vias extending therethrough so that multiple vias of each die substrate are in mutual vertical alignment with vias of at least another die substrate; and selectively electrically communicating at least one of the active semiconductor devices with at least one of the vias in the same die substrate as that semiconductor device.

19. The method of claim 18, wherein selectively electrically communicating the at least one semiconductor device comprises activating an antifuse.

20. A method of fabricating a die substrate, comprising:

providing a die substrate including a material suitable for fabrication of active semiconductor devices, the die substrate having a front side, a back side, and a lateral periphery;

forming in situ at least two electrically conductive vias through the die substrate between the front side and the back side thereof and within the lateral periphery;

fabricating an active semiconductor device on the front side of the die substrate and in electrical communication with at least one of the vias;

forming a terminal structure on one of the at least two vias for electrical communication by that via to a structure placed either above or below the die substrate;

assembling a plurality of die substrates, at least some of which include an active semiconductor device and all of which include a plurality of vias extending therethrough so that multiple vias of each die substrate are in mutual vertical alignment with vias of at least another die substrate; and selectively completing an electrically conductive path through at least one of the plurality of vias extending through at least one of the die substrates.

21. The method of claim 20, wherein selectively completing an electrically conductive path comprises activating an antifuse in said at least one of said plurality of vias.

22. A method of fabricating a die substrate, comprising:

providing a die substrate including a material suitable for fabrication of active semiconductor devices, the die substrate having a front side, a back side, and a lateral periphery;

forming in situ at least two electrically conductive vias through the die substrate between the front side and the back side thereof and within the lateral periphery;

fabricating an active semiconductor device on the front side of the die substrate and in electrical communication with at least one of the vias;

forming a terminal structure on one of the at least two vias for electrical communication by that via to a structure placed either above or below the die substrate;

assembling a plurality of die substrates, at least some of which include an active semiconductor device and all of which include a plurality of vias extending therethrough so that multiple vias of each die substrate are in mutual vertical alignment with vias of at least another die substrate; and assembling the plurality of die substrates on a carrier substrate and electrically communicating the active semiconductor devices of the die substrates to the carrier substrate through the vias.

23. The method of claim 22, further including assembling the plurality of die substrates so that at least one set of vertically aligned vias may be employed by at least some of the active semiconductor devices to commonly access the carrier substrate for a selected function.

24. A method of fabricating a plurality of die substrates, comprising:

providing a plurality of die substrates including a material suitable for fabrication of active semiconductor devices, the die substrates having a front side, a back side, and a lateral periphery;

forming in situ at least one electrically conductive, fusible or anti-fusible via through each of the die substrates between the front side and the back side thereof and within the lateral periphery;

forming at least a second electrically conductive, fusible or anti-fusible via extending between the front side and the back side of each of the die substrates;

fabricating an active semiconductor device on the front side of at least some of the die substrates and electrically communicating each active semiconductor device with the at least one via in the die substrate on which the active semiconductor device is fabricated;

forming a terminal structure on the at least second electrically conductive, fusible or anti-fusible via for electrical communication by that via to a structure placed either above or below the die substrate;

assembling the plurality of die substrates, so that multiple vias of each die substrate are in mutual vertical alignment with vias of at least one of the other die substrates;

selectively altering connectivity of an electrically conductive path extending through at least one of the vias in each of the die substrates; and selectively electrically communicating at least one of the active semiconductor devices with at least one of the vias in the same die substrate as that semiconductor device.

25. The method of claim 24, wherein selectively electrically communicating the at least one active semiconductor device comprises activating an antifuse.

26. A method of fabricating a plurality of die substrates, comprising:

providing a plurality of die substrates including a material suitable for fabrication of active semiconductor devices, the plurality of die substrates having a front side, a back side, and a lateral periphery;

forming in situ at least one electrically conductive via through each of the die substrates between the front side and the back side thereof and within the lateral periphery;

forming at least a second electrically conductive via extending between the front side and the back side of each of the die substrates;

fabricating an active semiconductor device on the front side of at least some of the die substrates and electrically communicating each active semiconductor device with the at least one via in the die substrate on which the active semiconductor device is fabricated;

forming a terminal structure on the at least second via for electrical communication by that via to a structure placed either above or below the die substrate;

assembling the plurality of die substrates, so that multiple vias of each die substrate are in mutual vertical alignment with vias of at least another die substrate;

selectively altering the connectivity of an electrically conductive path extending through at least one of the vias in each of the die substrate; and selectively completing an electrically conductive path through at least one of the vias extending through at least one of the die substrates.

27. The method of claim 26, wherein selectively completing the electrically conductive path comprises activating an antifuse in the at least one of electrically conductive the plurality of vias.

28. A method of fabricating a plurality of die substrates, comprising:

providing a plurality of die substrates including a material suitable for fabrication of active semiconductor devices, the die substrates having a front side, a back side, and a lateral periphery;

forming in situ at least one electrically conductive via through each of the die substrates between the front side and the back side thereof and within the lateral periphery;

forming at least a second electrically conductive via extending between the front side and the back side of each of the die substrates;

fabricating an active semiconductor device on the front side of at least some of the die substrates and electrically communicating each active semiconductor device with the at least one via in the die substrate on which the active semiconductor device is fabricated;

forming a terminal structure on the at least second via for electrical communication by that via to a structure placed either above or below the die substrate;

assembling the plurality of die substrates, so that multiple vias of each die substrate are in mutual vertical alignment with vias of at least another die substrate;

assembling the plurality of die substrates on a carrier substrate and electrically communicating the active semiconductor devices of the die substrates to the carrier substrate through the vias; and selectively altering the connectivity of an electrically conductive path extending through the at least one via in each of the die substrates.

29. The method of claim 28, further comprising assembling the plurality of die substrates so that at least one set of vertically aligned electrically conductive vias may be employed by at least some of the active semiconductor devices to commonly access the carrier substrate for a selected function.

30. A method of fabricating a die substrate, comprising:

providing a die substrate including a material suitable for fabrication of active semiconductor devices, the die substrate having a front side, a back side, and a lateral periphery;

forming in situ at least one electrically conductive via through the die substrate between the front side and the back side thereof and within the lateral periphery;

fabricating an active semiconductor device on the front side of the die substrate and in electrical communication with the at least one electrically conductive via; and selectively altering connectivity of an electrically conductive path extending through the at least one electrically conductive via in the die substrate subsequent to fabricating the active semiconductor device.

31. The method of claim 30, further comprising applying sufficient electrical or optical energy to selectively alter the connectivity of the electrically conductive path extending through the at least one electrically conductive via in the die substrate.

32. A method of fabricating a die substrate, comprising:

providing a die substrate including a material suitable for fabrication of active semiconductor devices, the die substrate having a front side, a back side, and a lateral periphery;

forming in situ at least two electrically conductive vias through the die substrate between the front side and the back side thereof and within the lateral periphery;

fabricating an active semiconductor device on the front side of the die substrate and in electrical communication with at least one of the vias;

forming a terminal structure on one of the at least two vias for electrical communication by that via to a structure placed either above or below the die substrate;

assembling a plurality of die substrates, at least some of which include an active semiconductor device and all of which include a plurality of vias extending therethrough so that multiple vias of each die substrate are in mutual vertical alignment with vias of at least another die substrate; and selectively opening a conductive path extending through at least one of the vias in at least one of the die substrates subsequent to fabricating the active semiconductor device thereon.

33. The method of claim 32, further comprising applying sufficient electrical or optical energy to selectively open the conductive path extending through at least one of the electrically conductive vias in the die substrate of the plurality of die substrate.

* * * * *

UNITED STATES PATENT AND TRADEMARK OFFICE
CERTIFICATE OF CORRECTION

PATENT NO. : 6,168,969 B1
DATED : January 2, 2001
INVENTOR(S) : Warren M. Farnworth It is certified that error appears in the above-identified patent and that said Letters Patent is hereby corrected as shown below:

Title page,
Item [57], ABSTRACT,
Lines 5 and 7, change "die" to -- dice --
Lines 13 and 15, after "carrier" insert -- substrate --

Column 1,
Line 31, change "J-lead packages (SOJ)" to -- J-lead (SOJ) packages --
Line 66, change "new" to -- New --

Column 3,
Line 40, change "die" to -- dice --

Column 4,
Line 19, after "effected" insert a comma -- , --
Line 20, after "partially" insert a comma -- , --

Column 5,
Line 20, before "traces" insert -- conductive --
Line 59, change "filer" to -- filler --
Line 60, before "dam" insert -- protective --

Column 6,
Line 4, change "extend" to -- extends --
Line 5, change "are" to -- is --
Line 7, change "provide" to -- provides --
Line 7, change "chipselect" to -- chip-select --
Line 13, change "die" to -- dice --
Line 21, change "dice" to -- die --
Line 22, change "die" to -- dice --

Column 7,
Line 41, after "second" insert -- electrically conductive --

Column 8,
Line 12, before the $2^{nd}$ occurrence of "die" insert -- the plurality of --

Column 9,
Line 11, change the $1^{st}$ occurrence of "a" to -- the --
Line 13, after "substrate" delete "of"
Line 37, before "semiconductor" insert -- active --
Line 63, before "electrically" change "an" to -- the --
Line 64, before "vias" insert -- electrically conductive --

UNITED STATES PATENT AND TRADEMARK OFFICE
CERTIFICATE OF CORRECTION

PATENT NO.   : 6,168,969 B1
DATED        : January 2, 2001
INVENTOR(S)  : Warren M. Farnworth It is certified that error appears in the above-identified patent and that said Letters Patent is hereby corrected as shown below:

<u>Column 10,</u>
Line 27, before "vias" insert -- electrically conductive --

<u>Column 11,</u>
Line 31, after "of" delete "electrically conductive"
Line 32, after "of" insert -- electrically conductive --

<u>Column 12,</u>
Line 1, after "altering" delete "the"
Line 61, change "substrate" to -- substrates --

Signed and Sealed this

Fifteenth Day of March, 2005

JON W. DUDAS
*Director of the United States Patent and Trademark Office*